(12) United States Patent
Liu et al.

(10) Patent No.: US 6,627,500 B1
(45) Date of Patent: Sep. 30, 2003

(54) METHOD OF FABRICATING NITRIDE READ ONLY MEMORY

(75) Inventors: Chien-Hung Liu, Taipei (TW); Shyi-Shuh Pan, Kaohsiung (TW); Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,796

(22) Filed: Aug. 19, 2002

(30) Foreign Application Priority Data

Apr. 8, 2002 (TW) ........................... 91106949 A

(51) Int. Cl.⁷ ......................................... H01L 21/8247
(52) U.S. Cl. ..................... 438/261; 438/287; 438/441; 438/978
(58) Field of Search ................. 438/216, 260, 438/261, 287, 439, 441, 444, 445, 739, 954, 978

(56) References Cited

U.S. PATENT DOCUMENTS

| | | | | |
|---|---|---|---|---|
| 4,407,696 A | * | 10/1983 | Han et al. ................... | 438/448 |
| 4,708,768 A | * | 11/1987 | Enomoto et al. ........... | 438/439 |
| 5,132,241 A | * | 7/1992 | Su ............................... | 438/448 |
| 5,236,862 A | * | 8/1993 | Pfiester et al. .............. | 438/439 |

* cited by examiner

*Primary Examiner*—Chandra Chaudhari
(74) *Attorney, Agent, or Firm*—Jiang Chyun IP Office

(57) ABSTRACT

A method of fabricating a nitride read only memory. A trapping dielectric sandwiched structure, including an insulation layer, a charge trap layer and an insulation layer, is formed on a substrate. An opening with indented sidewalls is formed in the insulation layer. A thermal oxide layer is formed to fill the opening, such that the indented sidewalls are completely sealed. The charge trap layer is thus sealed by the insulation layers and the thermal oxide layer to avoid the direct contact between the control gate and the charge trap layer, so as to prevent the data loss.

15 Claims, 3 Drawing Sheets

METHOD OF FABRICATING NITRIDE READ ONLY MEMORY

CROSS REFERENCE TO RELATED APPLICATIONS

This application claims the priority benefit of Taiwan application Ser. No. 91106949, filed on Apr. 8, 2002.

BACKGROUND OF INVENTION

1. Field of the Invention

The invention relates in general to a method of fabricating a memory, and more particularly, to a method of fabricating a nitride read only memory (NROM).

2. Description of the Related Art

Due to the data storage characteristics, the read only memory has been widely applied. The current read only memory includes the mask read only memory (mask ROM), the programmable read only memory (PROM), the erasable programmable read only memory (EPROM), the electrically erasable programmable read only memory (EEPROM), and the flash electrically erasable and programmable read only memory (flash EEPROM).

The erasable programmable read only memory has the programming function, erasable function and data retention after power source interrupt. To the equipment that requires the function of data retention and refresh such as the basic input output system (BIOS) in a personal computer and the electronic equipment, such memory has been commonly used. Especially, for the electrically erasable programmable read only memory that has the in-circuit electrical programming and electrical erase functions superior to the erasable programmable read only memory, it has becomes the orientation of future research and development.

A typical electrically erasable programmable read only memory uses doped polysilicon to fabricate a floating gate and a control gate. While programming, the electrons injected into the floating gate are evenly distributed in the polysilicon floating gate. Once defects exist in the tunneling oxide under the polysilicon floating gate, a leakage current is easily caused to affect the device reliability.

Currently, a nitride read only memory has been developed. The nitride read only memory has a trapping dielectric sandwiched structure on a substrate. The trapping dielectric sandwiched structure includes a structure of insulation layer-charge trap layer-insulation layer, for example, oxide-nitride-oxide (ONO). The charge trap layer has the function equivalent to the floating gate in the normal electrically erasable programmable read only memory. Yet, the control gate is still made of polysilicon. While programming the device by applying a voltage to the control gate and the floating gate, the electrons in the channel region close to the drain region are injected to the charge trap layer. Since silicon nitride has the characteristics of trapping electrons, the electrons injected into the charge trap layer are not uniformly distributed therein. Instead, the electrons injected to the charge trap layer are localized in an area with a Gaussian distribution. Therefore, the sensitivity towards the defects of the tunneling oxide layer is smaller, so that the leakage current is less possible to occur.

The conventional method of fabricating nitride read only memory is illustrated as FIG. 1A to FIG. 1C. In FIG. 1A, a substrate 100 is provided. The substrate 100 is delivered to a furnace to form an oxide layer 102. A charge trap layer 104 of which the material includes nitride, and an oxide layer 106 are formed on the oxide layer 102 by chemical vapor deposition. An oxide-nitride-oxide trapping dielectric sandwiched structure is thus formed on the substrate 100.

In FIG. 1B, a patterned photoresist layer 108 is formed on the oxide layer 106. An ion implantation step is performed on the substrate 100. Using the photoresist layer 108 as a mask, an anisotropic etching step is performed to remove portions of the oxide layer 106 and the charge trap layer 104 to form an opening 110.

In FIG. 1C, the substrate 100 is delivered in a furnace again. A thermal oxide layer 112 is formed in the opening 110 as an embedded drain region insulation layer. A polysilicon layer 114 is further formed as a control gate by chemical vapor deposition.

The above method for fabricating the nitride read only memory has the following drawbacks.

The opening formed by etching the oxide layer and the charge trap layer normally has a sidewall vertical to the substrate as shown in FIG. 1B. In the subsequent processes for forming the embedded drain insulation and the control gate, the embedded drain insulation layer is likely to have an elliptic shape due to the bird's beak effect. Moreover, the charge trap layer and the oxide layer on the opening sidewalls are crowded and pushed up by the elliptic embedded drain insulation layer. As shown in FIG. 1C, a contact between the charge trap layer 104 and the polysilicon layer 114 is formed to cause the device defect.

Though the electrons are concentrated in a local area of the charge trap layer, a gradual diffusion is inevitable for a long operation period. Consequently, as the charge trap layer is in direct contact with the polysilicon layer, the electrons flow to the polysilicon layer to cause the data loss.

SUMMARY OF INVENTION

The invention provides a method of fabricating a nitride read only memory. A substrate is provided. A first insulation layer, a charge trap layer and a second insulation layer are formed as a dielectric trapping sandwiched structure on the substrate. A pattern transfer layer is formed on the second insulation layer. Using the pattern transfer layer as a mask, the substrate is implanted to form a source/drain region. The pattern transfer layer is further used as a mask to etch the second insulation layer and the charge trap layer to form an opening. The pattern transfer layer is removed first, and then a wet etching step is further performed to remove a part of the charge trap layer on the sidewalls of the opening. As a result, an opening with indented sidewalls is formed. An embedded thermal oxide layer is formed to fill the opening. The indented sidewalls are completely sealed by the thermal oxide layer, and the charge trap layer is sealed with the first and second insulation layers and the thermal oxide layer. A conductive layer is then formed over the substrate as a control gate of the device.

As mentioned above, after forming the opening by etching the second insulation layer and the charge trap layer, a wet etching process is further performed on the opening. A part of the charge trap layer exposed by the opening is removed to result in an opening with an indented sidewall. Therefore, in the subsequent process, the embedded drain insulation layer with an elliptic shape due to the bird's effect seals the opening sidewall completely, such that the charge trap layer is sealed with the first and second insulation layers, and the embedded drain insulation. There is thus no contact between the conductive layer and the charge trap layer to maintain the integral of the device.

Since the charge trap layer has no contact with the control gate, the electrons in the charge trap layer have no access to flow over the control gate. Therefore, the data loss is prevented, and the capability of data retention is reinforced.

Both the foregoing general description and the following detailed description are exemplary and explanatory only and are not restrictive of the invention, as claimed.

DETAILED DESCRIPTION

FIG. 2A to FIG. 2E are cross sectional views showing the method of fabricating a nitride read only memory according to the invention.

Figure 1A:
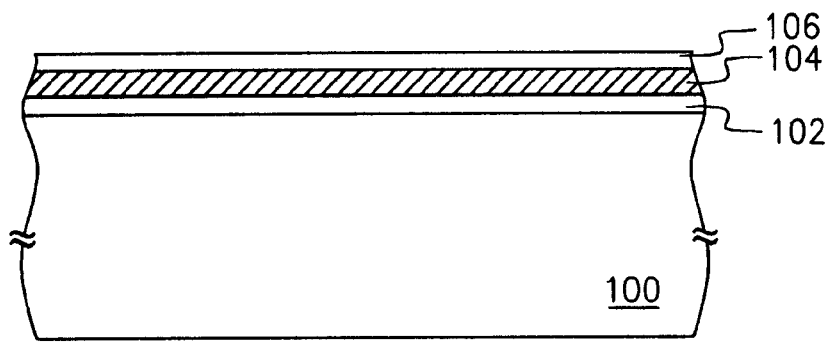
FIG. 1A to FIG. 1C are cross sectional views showing the conventional method of fabricating a nitride read only memory.
Figure 1B:
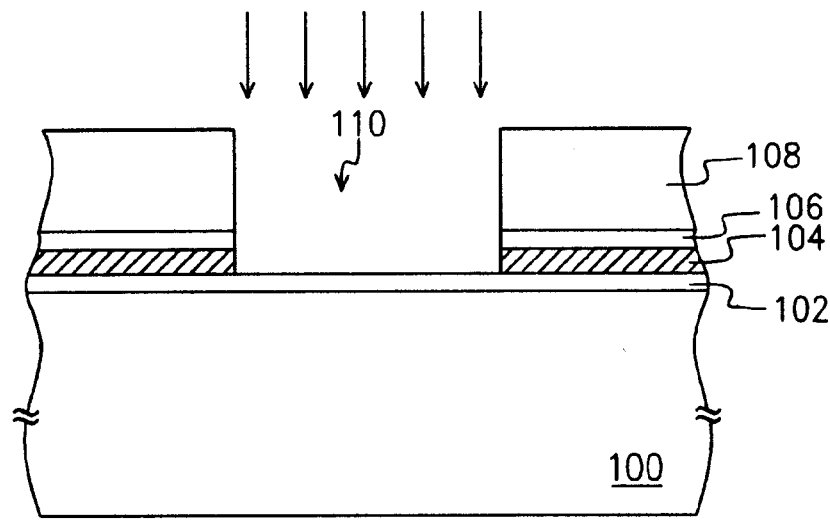
Figure 1C:
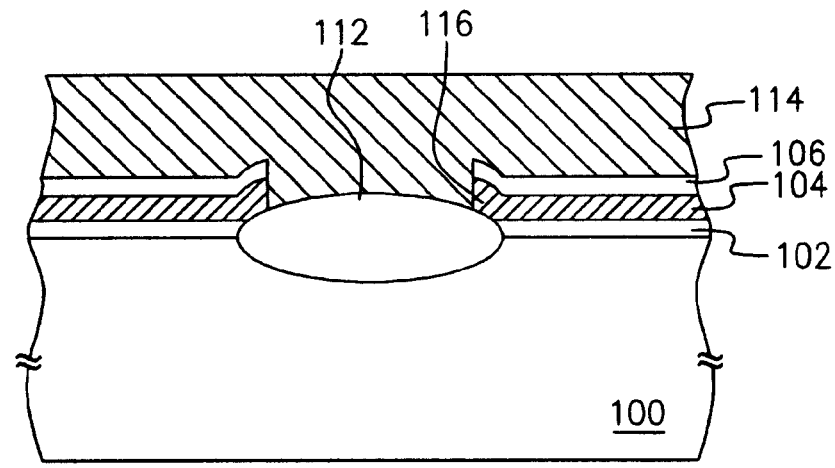
Figure 2A:
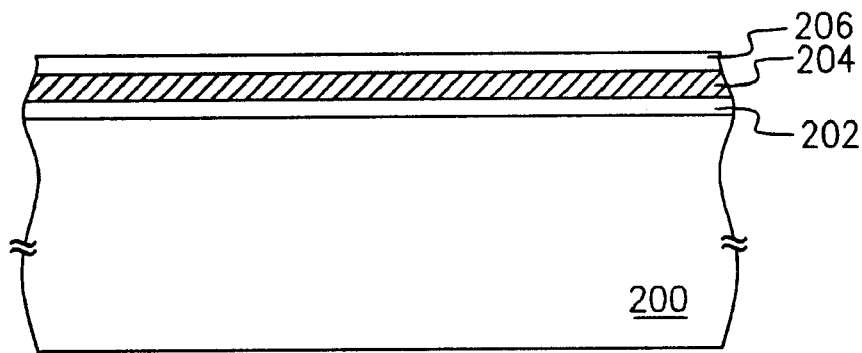
FIG. 2A to FIG. 2E are cross sectional views showing the method of fabricating a nitride read only memory according to the invention.

In FIG. 2A, a substrate 200 is provided. An insulation layer 202 is formed on the substrate 200. The material of the insulation layer 202 includes silicon oxide, for example, and the method for forming the insulation layer 202 includes a thermal process of which the substrate 200 is disposed in a furnace. A charge trap layer 204 is formed on the insulation layer 202. The material of the charge trap layer 204 includes silicon nitride layer formed by chemical vapor deposition with silane and ammonia as the gas sources, for example. An insulation layer 206 is formed on the charge trap layer 204. The material of the insulation layer 206 includes silicon oxide formed by low pressure chemical vapor deposition with silane and nitrogen monoxide as gas sources, or using thermal oxidation to oxidize the charge trap layer 204, for example. The insulation layer 202, the charge trap layer 204 and the insulation layer 206 construct a dielectric trapping sandwiched structure.

Figure 2B:
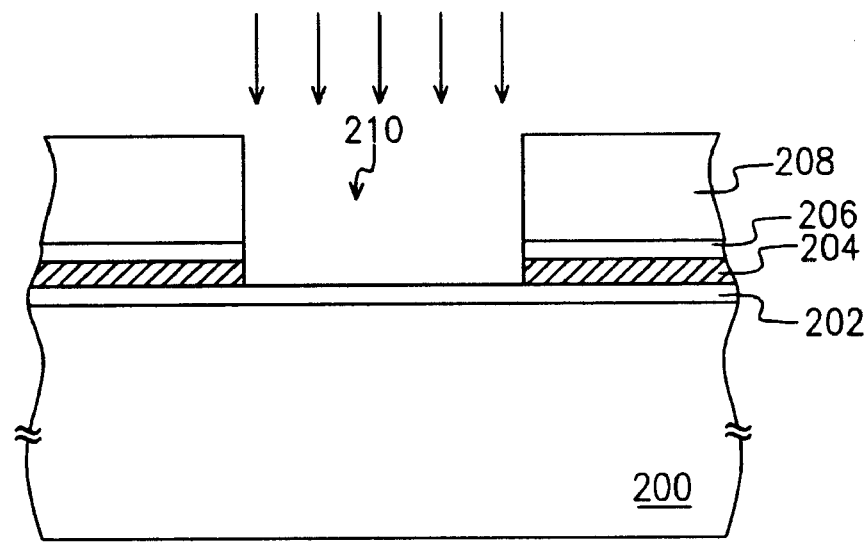

In FIG. 2B, a pattern transfer layer 208, for example, a photoresist layer, is formed on the insulation layer 206. Using the pattern transfer layer 208 as a mask, the substrate 200 is implanted with ions to form a source/drain region. Portions of the insulation layer 206 and the charge trap layer 204 are removed with the pattern transfer layer 208 as a mask to form an opening 210. The method for forming the opening 210 includes anisotropic etching that has the following conditions. While starting to etch the insulation layer 206, an operation pressure is ranged between about 10 mtorr to about 100 mtorr, and the operation power is ranged from about 100 W to about 500 W. When etching reaches a bottom of the insulation layer 206, the operation power is ranged between about 1 W and about 100 W, and the flow rate of the etching gas, carbon tetrafluoride, is adjusted to about 50 sccm to about 200 sccm. While starting etching the charge trap layer 204, the operation pressure is between about 10 mtorr to about 100 mtorr, and the operation power is from about 200 W to about 800 W. While reaching the bottom of the charge trap layer 204, the operation power is about 1 W to about 100 W, and the etching gas includes hydrogen bromide with a flow rate from about 10 sccm to about 50 sccm, and sulfur hexafluoride with a flow rate of about 10 sccm to about 50 sccm.

Figure 2C:
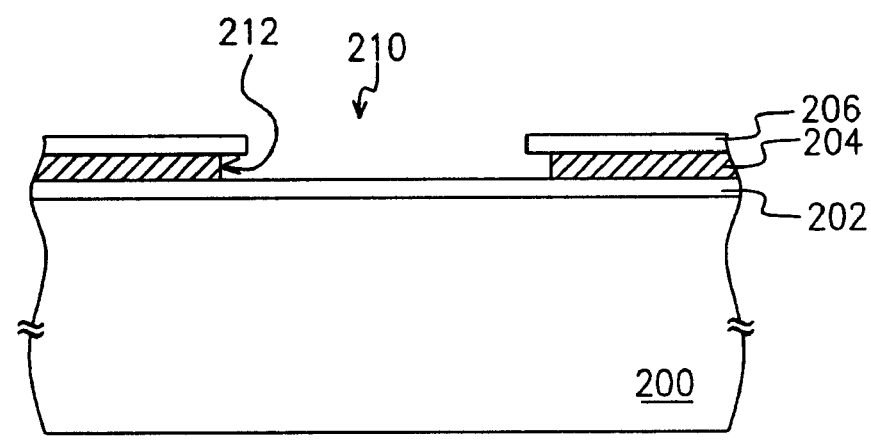

In FIG. 2C, a portion of the charge trap layer 204 exposed on the sidewall of the opening 210 is removed, such that an indented sidewall of the opening 210 is formed. For example, a wet etching step using a phosphoric acid with a temperature of about 20° C. to about 180° C. is performed. The substrate 200 is dipped in the phosphoric acid for about 0.5 minutes to about 5 minutes. As the phosphoric acid has a high selectivity for nitride compared to oxide, so that the insulation layers 202 and 204 are not removed in this step. As a result, the opening 210 with the indention or notch 212 is formed.

Figure 2D:
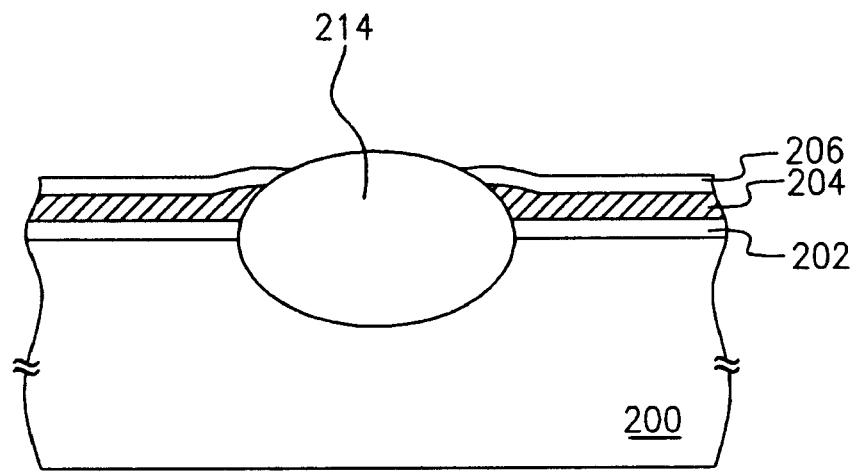

In FIG. 2D, a thermal oxide layer 214 is formed as an embedded drain insulation layer to fill the opening 210 and the indention 212, so that the charge trap layer 204 and insulation layer 202 are cohered with the thermal oxide layer 214. The method for forming the thermal oxide layer 214 includes sending the substrate 200 into a furnace for thermal oxidation. Due to the bird's beak effect, the profile of the thermal oxide layer 214 is elliptic. An indention 212 is formed on a sidewall of the opening 210, the thermal oxide layer 214 can thus closely cohere the charge trap layer 204 and insulation layer 202. Therefore, the charge trap layer 204 is wrapped with the insulation layers 202 and 204 and the thermal oxide layer 214 without any possibility to direct contact a control gate formed subsequently.

Figure 2E:
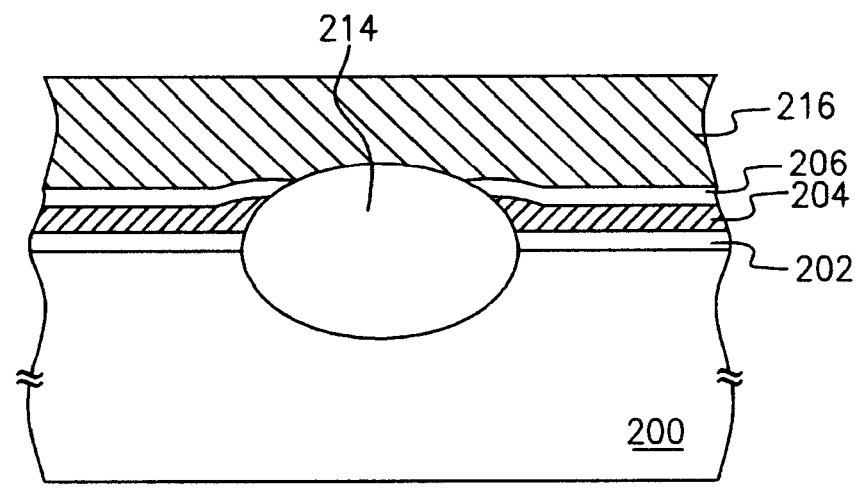

In FIG. 2E, a conductive layer 216 is formed over the substrate 200 as a control gate. The conductive layer 216 includes a doped amorphous layer, of which an in-situ doping is performed with the amorphous deposition. The method for forming the conductive layer 216 includes low pressure chemical vapor deposition with silane and hydrogen phosphide as gas sources. In addition, the conductive layer 216 may also comprise a metal silicide layer to reduce the resistance thereof. The metal silicide layer includes a tungsten silicide formed with hexafluoride and silane, or ethylene dichloride as gas sources.

In the above embodiment, in the step of etching the insulation layer 206 and the charge trap layer 204 for forming the opening 210, the insulation layer 202 may also be etched to expose a portion of the substrate 200.

The ion implantation step of forming the source/drain region may be performed before or after the opening 210 is formed.

According to the above, a wet etching step is inserted after forming the opening 210, such that an indention 212 is formed on the sidewall of the opening 210. The formation of such indention 212 causes a hermetic charge trap layer 204 from the control gate formed subsequently. The charge trap layer 204 is not in contact with the control gate, so that the integral of device is maintained.

Without the direct contact between the charge trap layer and the control gate, the electrons in the charge trap layer have no access to flow to the control gate to cause the data loss, and to enhance to data retention capability.

In the above embodiment, the fabrication process of a nitride read only memory is described as an example. It is appreciated that the invention is not limited to such structure only. For any device with the oxide-nitride-oxide structure, an embedded insulation layer can be formed in such opening with the indented sidwalls.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a nitride read only memory, comprising:

providing a substrate;

forming a first insulation layer on the substrate;

forming a charge trap layer on the first insulation layer;

forming a second insulation layer on the charge trap layer;

forming a pattern transfer layer on the second insulation layer;

etching the second insulation layer and the charge trap layer with the pattern transfer layer as a mask to form an opening;

removing the pattern transfer layer;

removing a part of the charge trap layer on a sidewall of the opening by wet etching using phosphoric acid as an etchant, so that a notch is formed on the sidewall;

forming an embedded drain insulation layer to fill the opening and the notch; and forming a conductive layer over the substrate as a control gate.

2. The method according to claim 1, wherein the phosphoric acid has a temperature at about 20° C. to bout 180° C.

3. The method according to claim 1, wherein the wet etching step is performed for about 0.5 minutes to about 5 minutes.

4. The method according to claim 1, wherein the step of forming the embedded drain insulation layer comprises a thermal oxidation step.

5. The method according to claim 1, further comprising a step of forming an embedded drain region in the substrate after forming the pattern transfer layer.

6. A method of fabricating a nitride read only memory, comprising:

providing a substrate;

forming a first insulation layer on the substrate;

forming a charge trap layer on the first insulation layer;

forming a second insulation layer on the charge trap layer;

forming a pattern transfer layer on the second insulation layer;

etching the first insulation layer, the second insulation layer and the charge trap layer with the pattern transfer layer as a mask to form an opening that exposes the substrate;

removing the pattern transfer layer;

removing a part of the charge trap layer on a sidewall of the opening by wet etching using phosphoric acid as an etchant, so that a notch is formed on the sidewall;

forming an embedded drain insulation layer to fill the opening and the notch; and forming a conductive layer over the substrate as a control gate.

7. The method according to claim 6, wherein the phosphoric acid has a temperature at about 20° C. to bout 180° C.

8. The method according to claim 6, wherein the wet etching step is performed for about 0.5 minutes to about 5 minutes.

9. The method according to claim 6, wherein the step of forming the embedded drain insulation layer comprises a thermal oxidation step.

10. The method according to claim 6, further comprising a step of forming an embedded drain region in the substrate after forming the pattern transfer layer.

11. A method of fabricating a semiconductor device, comprising:

providing a substrate, on which a first insulation layer, a charge trap layer and a second insulation layer are formed;

forming an opening in the second insulation layer and the charge trap layer, the opening having an indented sidewall, such that the opening has a diameter at the charge trap layer wider than a diameter at the second insulation layer, wherein the indented sidewall of the opening is formed by wet etching using phosphoric acid as an etchant;

forming an embedded drain insulation layer to fill the opening, wherein the embedded drain insulation layer closely coheres the charge trap layer; and forming a conductive layer over the substrate as a control gate.

12. The method according to claim 11, wherein the step of forming the charge trap layer includes a step of forming a nitride layer.

13. The method according to claim 11, wherein the phosphoric acid has a temperature at about 20° C. to bout 180° C.

14. The method according to claim 11, wherein the wet etching step is performed for about 0.5 minutes to about 5 minutes.

15. The method according to claim 11, wherein the step of forming the embedded drain insulation layer comprises a thermal oxidation step.

* * * * *